(12) United States Patent
Ferguson et al.

(10) Patent No.: US 10,962,594 B2
(45) Date of Patent: Mar. 30, 2021

(54) DEBUG INTERFACE RECORDER AND REPLAY UNIT

(71) Applicant: BAE SYSTEMS Information and Electronic Systems Integration Inc., Nashua, NH (US)

(72) Inventors: Richard J. Ferguson, Bealeton, VA (US); Marla J. Lassa, Manassas, VA (US); Dean Saridakis, Nokesville, VA (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 89 days.

(21) Appl. No.: 16/420,362

(22) Filed: May 23, 2019

(65) Prior Publication Data
US 2020/0371159 A1     Nov. 26, 2020

(51) Int. Cl.
*G01R 31/317*     (2006.01)
*G01R 31/3183*    (2006.01)

(52) U.S. Cl.
CPC .  *G01R 31/31705* (2013.01); *G01R 31/31835* (2013.01)

(58) Field of Classification Search
CPC .............. G01R 31/31705; G01R 31/31835
See application file for complete search history.

(56) References Cited

U.S. PATENT DOCUMENTS

| 6,094,729 A | * | 7/2000 | Mann | G06F 11/348 |
| | | | | 714/25 |
| 2004/0255199 A1 | * | 12/2004 | Yamashita | G06F 21/629 |
| | | | | 714/37 |
| 2012/0176153 A1 | * | 7/2012 | Quinton | G06F 30/34 |
| | | | | 326/37 |
| 2017/0269157 A1 | * | 9/2017 | Mao | G06F 12/1027 |

OTHER PUBLICATIONS

J. Goeders and S. J. E. Wilton, "Effective FPGA debug for high-level synthesis generated circuits," 2014 24th International Conference on Field Programmable Logic and Applications (FPL), Munich, 2014, pp. 1-8. (Year: 2014).*

H. Thane, D. Sundmark, J. Huselius and A. Pettersson, "Replay debugging of real-time systems using time machines," Proceedings International Parallel and Distributed Processing Symposium, Nice, France, 2003, (Year: 2003).*

* cited by examiner

*Primary Examiner* — Cynthia Britt
(74) *Attorney, Agent, or Firm* — KPIP Law, PLLC; Scott J. Asmus

(57) ABSTRACT

The system and method of using a debug interface recorder and replay unit for debugging and testing devices of interest such as integrated circuits by using a debug interface buffer controller to receive, record, and replay sequences of instructions to the integrated circuit. This is particularly useful for deployed devices that are difficult or dangerous to access. This is also beneficial for devices that cannot be reached (e.g., after launch). By recording sequences and storing them for later use, and by communicating commands and configuration settings to a device, system maintenance and troubleshooting is accomplished saving valuable time and money without requiring physical access to the device of interest.

18 Claims, 4 Drawing Sheets

DEBUG INTERFACE RECORDER AND REPLAY UNIT

FIELD OF THE DISCLOSURE

The present disclosure relates to fault testing and debugging for remote hardware and more particularly to using a debug port recorder and replay unit for debugging and programming integrated circuits and circuit cards that are otherwise inaccessible.

BACKGROUND OF THE DISCLOSURE

Oftentimes integrated circuits, circuit cards and the like, come with pre-loaded or external custom toolsets used to aid in their development, design and verification. These third-party provided toolsets are built with the assumption that the implementation of a particular function is to operate as expected. When this is not the case and the resulting hardware (e.g., integrated circuit) is not demonstrating desired functionality, debugging these toolsets can be extremely difficult and time consuming. Hardware designers typically have to work with the toolkit providers to obtain insight and knowledge to help identify where a particular implementation may have failed.

Current solutions to this issue are often dependent on the cooperation of third parties to aid a hardware designer in hardware debugging. In some cases, a small delivery volume translates to a low priority to these third party providers making the solution unlikely or extremely slow. This puts hardware designers in the position of needing to spend additional resources to become knowledgeable about the toolkits beyond what would otherwise be necessary.

Wherefore it is an object of the present disclosure to overcome the above-mentioned shortcomings and drawbacks associated with the conventional debugging and programming systems by providing a hardware debug recorder and replay unit.

SUMMARY OF THE DISCLOSURE

The system of the present disclosure provides a much needed solution to the debugging problem by providing a hardware debug recorder and replay unit and by focusing the investigation directly on the sequence of events that triggers a failure.

One aspect of the present disclosure is a debug interface recorder and replay unit for an integrated circuit, comprising: a debug interface controller configured to monitor a plurality of debug interface instructions and data; a storage buffer configured to store the plurality of debug interface instructions and data received from the debug interface controller during record operations and to supply the plurality of debug interface instructions and data to the debug interface controller during replay operations; and a debug interface multiplexer configured to switch between a plurality of external debug interface inputs and the plurality of debug interface instructions and data from the debug interface controller for implementing the plurality of debug interface instructions and data on the integrated circuit.

One embodiment of the debug interface recorder and replay unit for an integrated circuit further comprises a debug interface receiver configured to drive inbound debug interface sequences to both the debug interface controller and the debug interface multiplexer.

Another embodiment of the debug interface recorder and replay unit for an integrated circuit further comprises a debug interface monitor port on the debug interface controller configured to observe inbound debug interface sequences from external debug interface hardware. One embodiment of the debug interface recorder and replay unit for an integrated circuit is wherein the inbound debug interface sequences from external debug interface hardware may include TRST, TCK, TMS, or TDI.

Yet another embodiment of the debug interface recorder and replay unit for an integrated circuit further comprises outbound debug interface responses from the integrated circuit which are fed back through the debug interface multiplexer and may include TDO.

In some cases, the debug interface recorder and replay unit for an integrated circuit further comprises a debug interface driver configured to redrive the plurality of debug interface signals and data back to the integrated circuit for implementation by the integrated circuit.

Certain embodiments of the debug interface recorder and replay unit for an integrated circuit are wherein the debug interface controller is commanded and configured over a bus interface attached to the integrated circuit.

Still yet another embodiment of the debug interface recorder and replay unit for an integrated circuit further comprises sideband control signals such as a RESET instruction which are used to control the integrated circuit.

Another aspect of the present disclosure is a method for testing or debugging an integrated circuit, comprising: monitoring a plurality of inbound debug interface instructions and inbound data via a debug interface controller; storing the plurality of inbound debug interface instructions and inbound data received from the controller via a storage buffer during a record operation; supplying the plurality of inbound debug interface instructions and inbound data to the controller via the storage buffer during a replay operation; and controlling a debug interface multiplexer by the debug interface controller to switch between providing the plurality of inbound debug interface instructions and inbound data back to the integrated circuit for implementation by the integrated circuit; and providing to the debug interface controller a plurality of outbound data received from the integrated circuit.

One embodiment of the method for testing or debugging an integrated circuit further comprises driving inbound debug interface sequences to both the debug interface controller and the debug interface multiplexer via a debug interface receiver.

Another embodiment of the method for testing or debugging an integrated circuit further comprises observing inbound debug interface sequences from external debug interface hardware via a debug interface monitor port on the debug interface controller. In some cases, the inbound debug interface sequences from external debug interface hardware may include TRST, TCK, TMS, or TDI.

Yet another embodiment of the method for testing or debugging an integrated circuit further comprises feeding debug interface responses from the integrated circuit back through the debug interface multiplexer which may include TDO.

Still yet another embodiment of the method for testing or debugging an integrated circuit further comprises redriving the plurality of debug interface signals and data back to the integrated circuit via a debug interface driver for implementation by the integrated circuit.

Certain embodiments of the method for testing or debugging an integrated circuit further comprise commanding and configuring the debug interface controller over a bus interface attached to the integrated circuit.

In some cases, the method for testing or debugging an integrated circuit further comprises controlling the integrated circuit via sideband control signals such as a RESET instruction for implementation by the integrated circuit.

These aspects of the disclosure are not meant to be exclusive and other features, aspects, and advantages of the present disclosure will be readily apparent to those of ordinary skill in the art when read in conjunction with the following description, appended claims, and accompanying drawings.

BRIEF DESCRIPTION OF THE DRAWINGS

The foregoing and other objects, features, and advantages of the disclosure will be apparent from the following description of particular embodiments of the disclosure, as illustrated in the accompanying drawings in which like reference characters refer to the same parts throughout the different views. The drawings are not necessarily to scale, emphasis instead being placed upon illustrating the principles of the disclosure.

DETAILED DESCRIPTION OF THE DISCLOSURE

Figure 1:
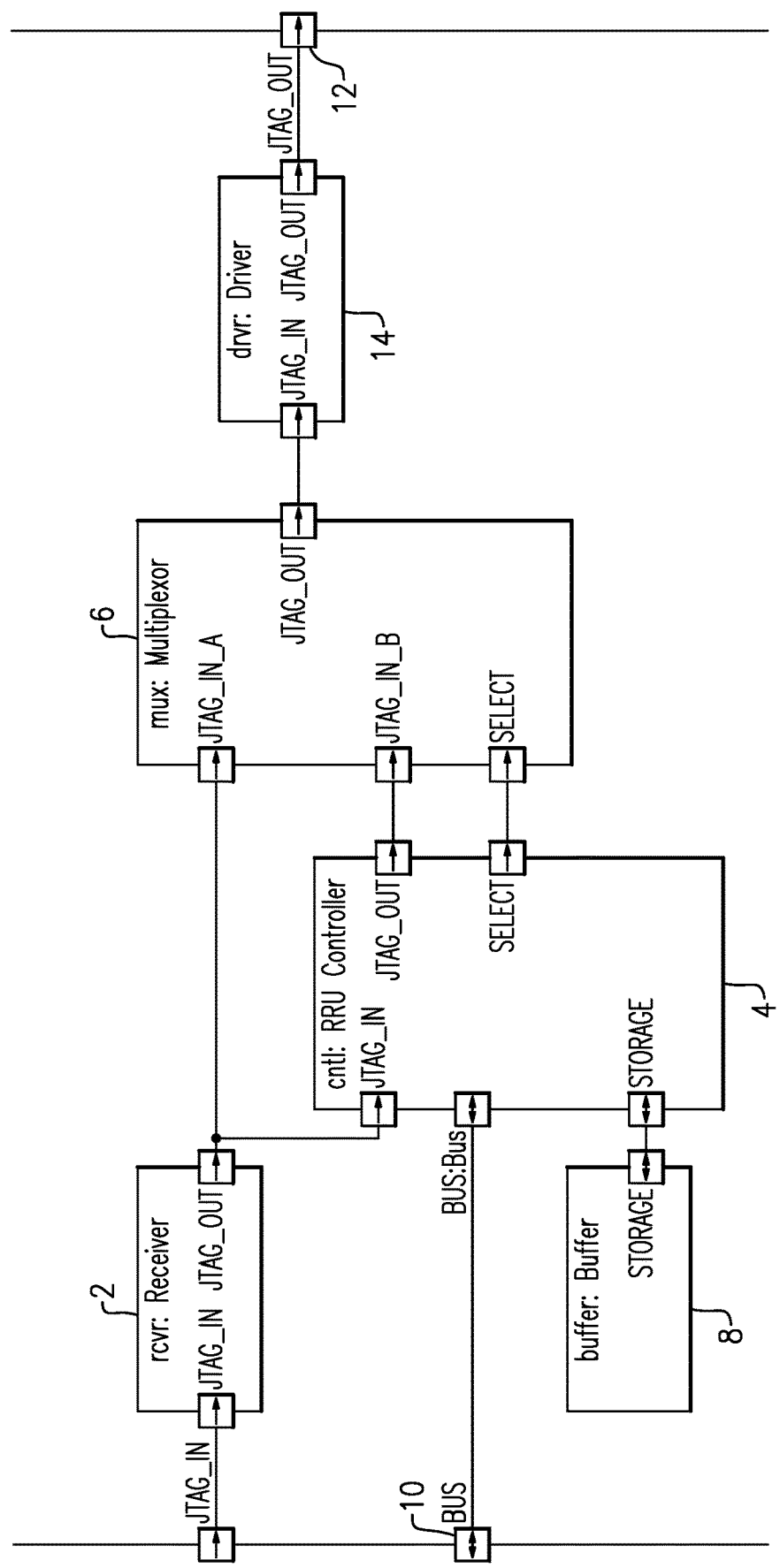
FIG. 1 is a diagrammatic view of one embodiment of the debug interface recorder and replay unit of the present disclosure.

One embodiment of the present disclosure is a debug port recorder and replay unit that is coupled or embedded in an integrated circuit or circuit card assembly to remove the need for third party cooperation for effective hardware debugging. In one embodiment, the debug interface is a joint test action group (JTAG) interface. In part, JTAG specifies the use of a dedicated debug port to provide access to system addresses and data busses without requiring direct external access. The external JTAG debug hardware controller connects to an on-chip test access port (TAP) that implements protocols designed to enable access to and control internal functions of the FPGA or integrated circuit.

As noted above, third party provided toolsets are often able to expose implementation issues when standard development operations fail, but clarity on those operations is typically hidden behind those same tools. Hardware designers may know something doesn't work, but they are unable to see the exact sequence of events that triggers a failure. One embodiment of the debug interface recorder and replay unit of the present disclosure sits transparently in the debug interface system and is able to record the sequence of debug interface instructions and data commands so these can be examined to identify the exact sequence of events that triggered the failure. Additionally, the system of the present disclosure can store and then replay these sequences of events on hardware without use of the original toolset. To some extent this can be thought of as the hardware debug controller interface being a "sniffer" for traffic to and from the device of interest and the debug interface recorder and replay unit system of the present disclosure is sniffing the sniffer.

It is understood that external access to hardware is not always possible and a system such as the one described herein is invaluable. In some cases, hardware might be remote such as launched into space and physical access to it once it encounters an error is not feasible. In other cases, the hardware may be installed inside a power plant or some other place where physical access is dangerous. In situations such as these, the system of the present disclosure can replay a series of events and capture the results to determine when in the sequence a particular error or fault occurred. This can provide insight into the error and enable a strategy to work around a particular error to get the hardware back online and functioning as intended.

In one exemplary use case, a customer might reach out to a device manufacturer when the hardware has not executed as expected. Engineers could head to the lab to perform some debug and testing on a representative engineering unit to identify the most probable cause. However, there are times when data from the specific situation is important for the diagnosis. Then, as described herein, one might use a recorder and replay unit (RRU) to capture an actual debug sequence for the customer to run. The RRU would be enabled on the engineering lab unit to capture a JTAG sequence. This would be followed by issuing a series of commands from the hardware debug controller tool. The captured JTAG sequence could then be downloaded from the engineering unit and the JTAG sequence is sent to the customer. The customer could then load the JTAG sequence into the RRU on the misbehaving hardware, triggering sequence execution and capturing the output. This output could then be sent back to the engineers.

The engineers would then inspect the captured output and be able to further investigate and ultimately diagnose the error. This can be repeated, as needed. Up until the development of the present disclosure of a RRU concept, this was only possible when a customer could physically attach hardware debug tools to the misbehaving hardware. One major problem with prior systems is that once a unit is boxed up and attached to a satellite or launched, or otherwise installed in a hard to reach area, there is no way to physically attach debug tools, and the ability to capture data is greatly reduced. In one embodiment of the present disclosure a hard to access circuit such as a flight board computer orbiting earth performs these actions using an embedded RRU for devices that are not easily accessible.

Referring to FIG. 1, a diagrammatic view of one embodiment of the debug interface recorder and replay unit of the present disclosure is shown. More particularly, in one embodiment of the debug interface recorder and replay unit (RRU) of the present disclosure, a debug interface receiver 2 buffers inbound debug interface (e.g., JTAG) commands enroute to a RRU controller 4 and an outbound debug interface multiplexer 6. The RRU controller 4, records inbound debug interface commands into a storage buffer 8. The sequence of commands is able to be read from the storage buffer 8 through the RRU controller 4 and across the integrated circuits' (e.g., FPGA) internal system bus 10 such as for inspection by a user. A user in one example is also able to write debug interface sequences and data to the storage buffer 8 through the system bus 10 and RRU controller 4. Then the RRU controller is configured to issue a sequence of commands through the outbound debug interface multiplexer 6 to the unit under test (UUT) or device of interest (DOI) 12 as part of a replay operation. A driver module 14 can be used to condition the outbound commands for the unit under test.

Figure 2:
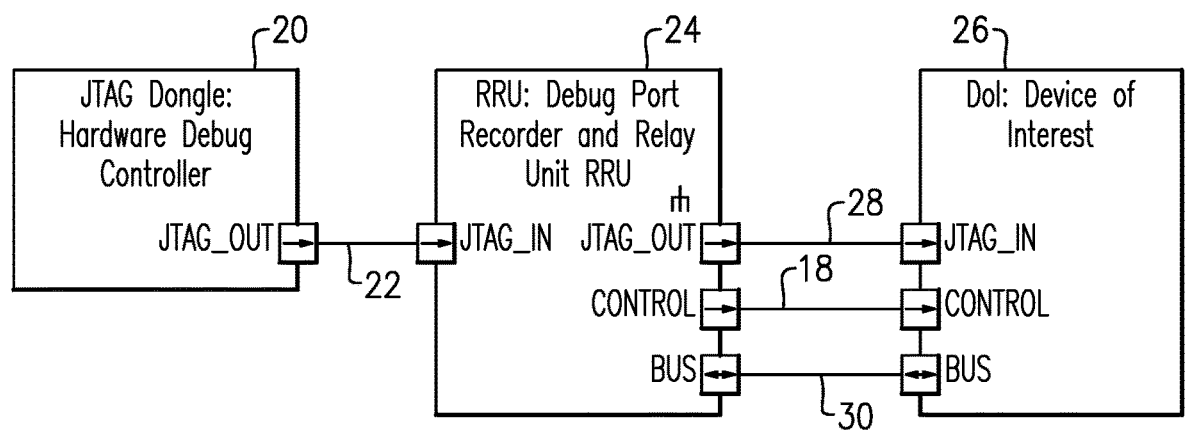
FIG. 2 is a diagrammatic view of one embodiment of the debug interface recorder and replay unit of the present disclosure as shown within a debug interface system.

Referring to FIG. 2, a diagrammatic view of one embodiment of the debug interface recorder and replay unit 24 of the present disclosure as shown within a debug interface system. More specifically, a hardware debug module 20 is shown. In some cases, that is an optional JTAG dongle. This provides a typical debug interface 22 from external hardware. One embodiment of the RRU 24 is implemented or embedded on an FPGA or ASIC (application specific integrated circuit), circuit card or the like and sits between the external hardware 20 and the device of interest 26. In some cases, the device of interest 26 is an FPGA or similar ASIC. The RRU 24 is in communication with the DOI 26 via an inbound interface 28 and an outbound sideband bus interface 30. In some cases, the sideband bus interface 30 enables "self debug" command flows from the DOI 26 to the RRU 24 and the data runs from the RRU 24 back to the DOI 26. In some cases, the DOI experiences an error flag or arrives at a periodic time and institutes a debug procedure on itself without user input.

In certain embodiments, the RRU could be used for issuing any debug interface related command sequences without the need for a debug interface hardware unit 20 (e.g., a dongle). In some cases, the RRU is useful to 'self issue' debug interface commands, which is not possible with conventional systems. In some cases, self issuing a debug is akin to self-debugging and the system can use parameters to define when such an action is taken by a RRU.

In one embodiment of the system, a board/hardware installation implements the RRU and is able to perform the following in isolation, without the need for a hardware debug module. In certain embodiments, the device of interest (DOI) writes 'JTAG sequence' to the RUU over a 'BUS interface'. In certain embodiments, the JTAG sequence may be as follows: 1) Assert RESET by the RRU to the DOI; 2) Issue JTAG instruction from the DOI to the RRU over the bus; 3) Release RESET to the DOI; 4) Issue JTAG instruction from the DOI to the RRU over the bus; 5) Write or Read JTAG data at the RRU; and 6) Repeat steps, as needed.

In some cases, the DOI writes a command to the RRU over a BUS interface to trigger execution of one or more 'JTAG sequences'. The RRU executes the 'HAG sequence(s)' against the DOI over a 'JTAG interface.' In certain embodiments, the 'JTAG interface' may also include a system RESET to the DOI or other sideband control signals. In some cases, the DOI reads results from the RRU over 'BUS interface', and acts on the results.

In one embodiment an engineering version of flight hardware is used to develop a 'HAG sequence.' The sequence is then sent to the flight hardware over normal communication channels to initiate a "self debug" for the DOI. Then, going back in over the same flight communications channel the result is read by the RRU. This can be repeated, as needed until the system is diagnosed and repaired.

In certain embodiments of the RRU of the present disclosure, a JTAG, or debug interface, sequence is described, as follows. A JTAG Sequence describes a series of JTAG and/or control commands which may be comprised of one or more of the following: JTAG Instruction Command—which may include status register expect data (all JTAG commands are 8 bits, and when shifting in those 8 bits, a device specific status value is usually scanned out); JTAG Data Command—which includes data to be written, and may include expected data to be read. In one example, for every bit of data shifted into the device of interest, a bit is shifted out. And, a Control Signal Configure Command—which may manipulate multiple control signals in one command. In some cases, as the RRU controller monitors the JTAG interface from external hardware, it generates a JTAG sequence and stores it in the storage buffer. There, the stored JTAG sequence can be: 1) replayed against the DOI, and/or read over the bus interface by the DOI for a replay operation, or 2) a JTAG sequence can be written to the storage buffer across the bus interface by the DOI for a record operation.

In certain embodiments, when a JTAG sequence is replayed, and if there is expected data in the JTAG Sequence, that data can be compared to the captured data and if the data does not match, an error condition is also stored in the buffer controller for later evaluation. In some cases, all raw data is stored.

Figure 3:
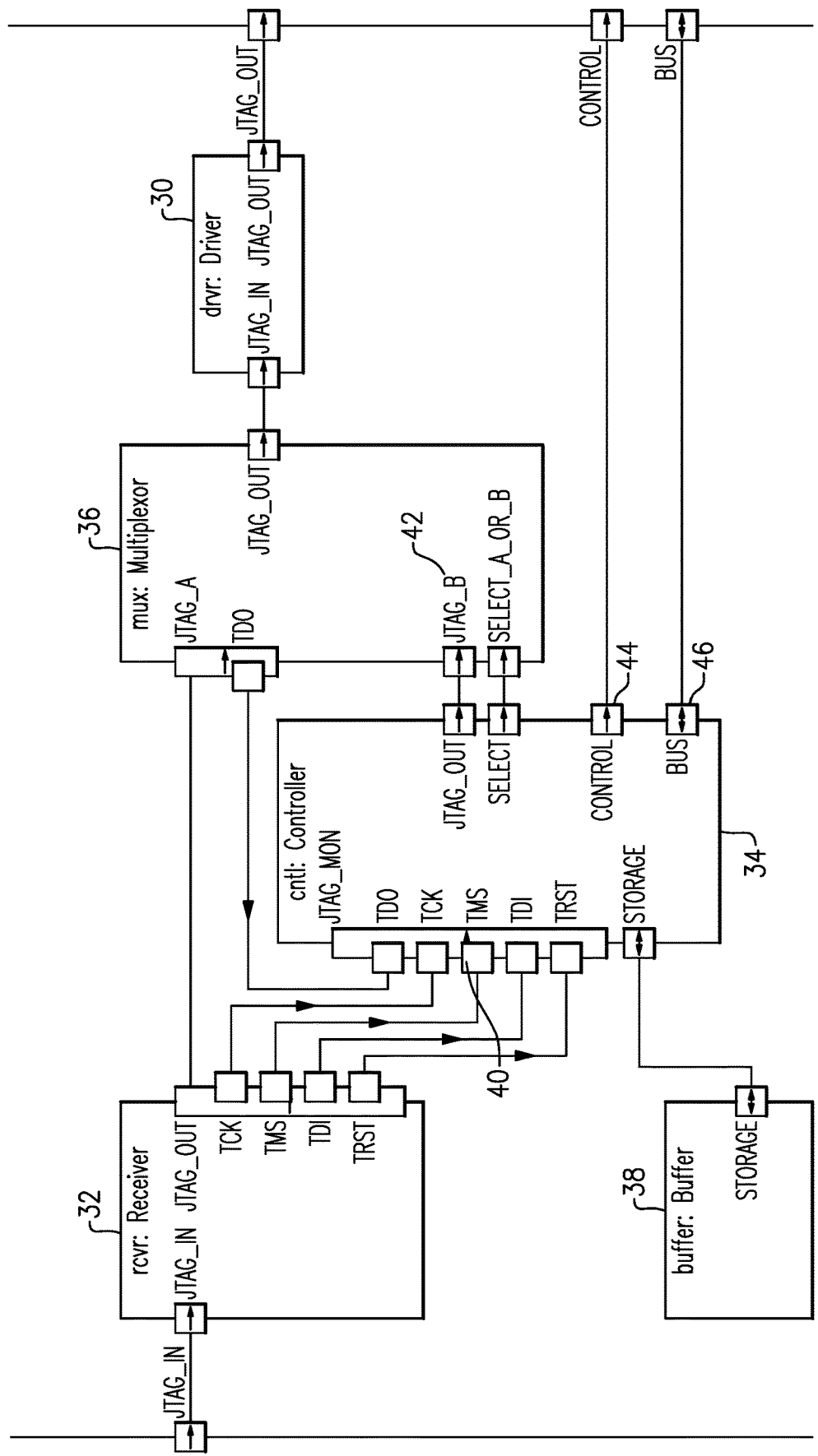
FIG. 3 is a more detailed diagrammatic view of one embodiment of the debug interface recorder and replay unit of the present disclosure.

Referring to FIG. 3, a more detailed diagrammatic view of one embodiment of the debug interface recorder and replay unit of the present disclosure is shown. More specifically, a debug interface receiver 32 drives inbound debug interface sequences and data (e.g. JTAG sequences) to both the debug interface controller 34 and the debug interface multiplexer 36. In some cases, the debug interface controller 34 monitors the incoming debug interface sequences and stores them in the debug interface storage buffer 38. The debug interface storage buffer 38 stores the debug interface sequences during record operations and then supplies these sequences and data to the debug interface controller 34 for replay operations. A debug interface monitor port 40 on the debug interface controller 34 observes inputs from external debug interface hardware (e.g., TRST, TCK, TMS, TDI) and outputs from the DOI which are then fed back through the debug interface multiplexer 36 (e.g., TDO). In one embodiment, connector pins are: TDI (Test Data In); TDO (Test Data Out); TCK (Test Clock); TMS (Test Mode Select) and TRST (Test Reset) optional. In some cases, the debug interface multiplexer 36 switches between external debug interface input and internal controller debug interface input for driving the DOI depending from where the input to the multiplexer originates. A debug interface driver 30 redrives the debug interface signals back to the DOI for implementation by the DOI. Still referring to FIG. 3, the debug interface controller 34 acts as the brain of the system. During record operations, the debug interface controller 34 stores sequences of instruction and data coming in "JTAG_IN" into the buffer 38. During replay operations, the debug interface controller 34 reads from the buffer 38 and drives the instructions and data to the debug interface multiplexer 36. The debug interface controller 34 is commanded and configured over a bus interface 46, which is attached to the DOI. In some cases, a generic bus interface 46 from the DOI is used to enable configuration and control commands from the DOI to the debug interface controller 34. In some cases, sideband control signals 44 such as a RESET instruction may be required to fully control the DOI may also be present.

Figure 4:
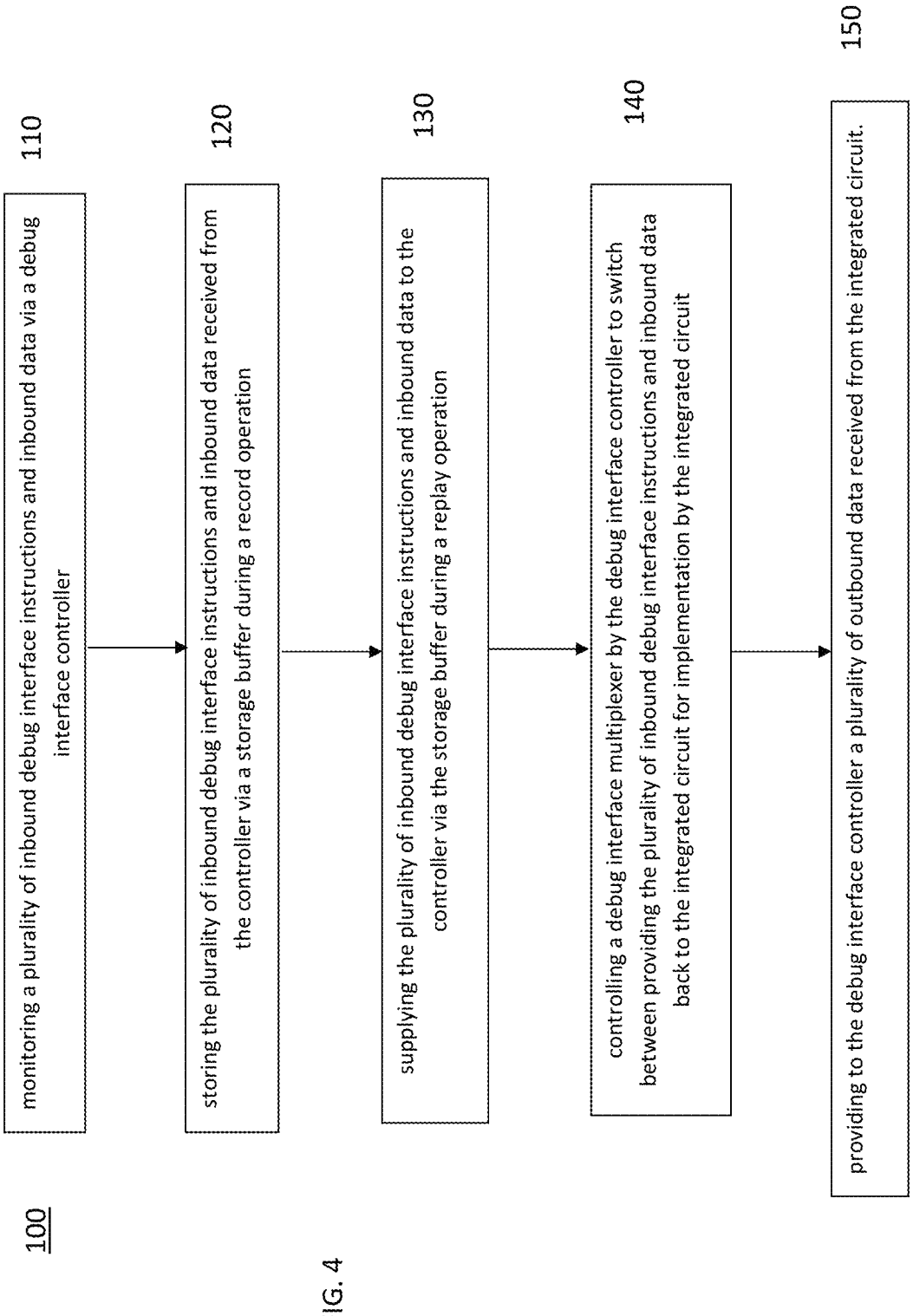
FIG. 4 shows a flowchart of one embodiment of a method according to the principles of the present disclosure.

Referring to FIG. 4, a process flow of the debug operations 100 is illustrated according to one embodiment. The RRU unit in one example is embedded onto the integrated circuit or circuit card during manufacture or added as an integrated component. The port connection, such as a JTAG port, allow for supplying inbound debug interface sequences and data which as an input to the debug interface controller and the debug interface multiplexer 110. The inbound debug interface sequences and data go from the multiplexer to a driver unit that can format the data, if needed, to accommodate the hardware. The inbound debug interface sequences and data go from the driver back to the hardware unit DOI for implementation by the integrated circuit in a replay operation. The inbound debug interface sequences and data in the controller is also stored in a memory unit such as a storage buffer during the record operations 120. When requested, the stored debug interface sequences and data from the memory are provided to the controller and the data from the memory 130. In some cases, a debug interface multiplexer is controlled by the debug interface controller to switch between providing the plurality of inbound debug interface instructions and inbound data back to the integrated circuit for implementation by the integrated circuit 140. In certain embodiments, a plurality of outbound data received from the integrated circuit is provided to the debug interface controller 150.

The computer readable medium as described herein can be a data storage device, or unit such as a magnetic disk, magneto-optical disk, an optical disk, or a flash drive. Further, it will be appreciated that the term "memory" herein is intended to include various types of suitable data storage media, whether permanent or temporary, such as transitory electronic memories, non-transitory computer-readable medium and/or computer-writable medium.

It will be appreciated from the above that the invention may be implemented as computer software, which may be supplied on a storage medium or via a transmission medium such as a local-area network or a wide-area network, such as the Internet. It is to be further understood that, because some of the constituent system components and method steps depicted in the accompanying Figures can be implemented in software, the actual connections between the systems components (or the process steps) may differ depending upon the manner in which the present invention is programmed. Given the teachings of the present invention provided herein, one of ordinary skill in the related art will be able to contemplate these and similar implementations or configurations of the present invention.

It is to be understood that the present invention can be implemented in various forms of hardware, software, firmware, special purpose processes, or a combination thereof. In one embodiment, the present invention can be implemented in software as an application program tangible embodied on a computer readable program storage device. The application program can be uploaded to, and executed by, a machine comprising any suitable architecture.

While various embodiments of the present invention have been described in detail, it is apparent that various modifications and alterations of those embodiments will occur to and be readily apparent to those skilled in the art. However, it is to be expressly understood that such modifications and alterations are within the scope and spirit of the present invention, as set forth in the appended claims. Further, the invention(s) described herein is capable of other embodiments and of being practiced or of being carried out in various other related ways. In addition, it is to be understood that the phraseology and terminology used herein is for the purpose of description and should not be regarded as limiting. The use of "including," "comprising," or "having," and variations thereof herein, is meant to encompass the items listed thereafter and equivalents thereof as well as additional items while only the terms "consisting of" and "consisting only of" are to be construed in a limitative sense.

The foregoing description of the embodiments of the present disclosure has been presented for the purposes of illustration and description. It is not intended to be exhaustive or to limit the present disclosure to the precise form disclosed. Many modifications and variations are possible in light of this disclosure. It is intended that the scope of the present disclosure be limited not by this detailed description, but rather by the claims appended hereto.

A number of implementations have been described. Nevertheless, it will be understood that various modifications may be made without departing from the scope of the disclosure. Although operations are depicted in the drawings in a particular order, this should not be understood as requiring that such operations be performed in the particular order shown or in sequential order, or that all illustrated operations be performed, to achieve desirable results.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure.

What is claimed:

1. A debug interface recorder and replay unit for an integrated circuit, comprising:
   a debug interface controller configured to monitor a plurality of debug interface instructions and data;
   a storage buffer configured to store the plurality of debug interface instructions and data received from the debug interface controller during record operations and to supply the plurality of debug interface instructions and data to the debug interface controller during replay operations; and
   a debug interface multiplexer configured to switch between a plurality of external debug interface inputs and the plurality of debug interface instructions and data from the debug interface controller for implementing the plurality of debug interface instructions and data on the integrated circuit,
   wherein the debug interface recorder and replay unit sits transparently in a debug interface system.

2. The debug interface recorder and replay unit for an integrated circuit according to claim 1, further comprising a debug interface receiver configured to drive inbound debug interface sequences to both the debug interface controller and the debug interface multiplexer.

3. The debug interface recorder and replay unit for an integrated circuit according to claim 1, further comprising a debug interface monitor port on the debug interface controller configured to observe inbound debug interface sequences from external debug interface hardware.

4. The debug interface recorder and replay unit for an integrated circuit according to claim 3, wherein the inbound debug interface sequences from external debug interface hardware may include TRST (Test Reset), TCK (Test Clock), TMS (Test Mode Select), or TDI (Test Data In).

5. The debug interface recorder and replay unit for an integrated circuit according to claim 1, further comprising outbound debug interface responses from the integrated circuit which are fed back through the debug interface multiplexer and may include TDO (Test Data Out).

6. The debug interface recorder and replay unit for an integrated circuit according to claim 1, further comprising a debug interface driver configured to redrive the plurality of debug interface signals and data back to the integrated circuit for implementation by the integrated circuit.

7. The debug interface recorder and replay unit for an integrated circuit according to claim 1, wherein the debug interface controller is commanded and configured over a bus interface attached to the integrated circuit.

8. The debug interface recorder and replay unit for an integrated circuit according to claim 1, further comprising sideband control signals such as a RESET instruction which are used to control the integrated circuit.

9. The debug interface recorder and replay unit for an integrated circuit according to claim 1, wherein the integrated circuit is a circuit card assembly, application specific integrated circuit, or field programmable gate array.

10. A method for testing or debugging an integrated circuit, comprising:
monitoring a plurality of inbound debug interface instructions and inbound data via a debug interface controller;
storing the plurality of inbound debug interface instructions and inbound data received from the controller via a storage buffer during a record operation;
supplying the plurality of inbound debug interface instructions and inbound data to the controller via the storage buffer during a replay operation; and
controlling a debug interface multiplexer by the debug interface controller to switch between providing the plurality of inbound debug interface instructions and inbound data back to the integrated circuit for implementation by the integrated circuit; and
providing to the debug interface controller a plurality of outbound data received from the integrated circuit,
wherein the debug interface controller, the storage buffer, and the debug interface multiplexer sits transparently in a debug interface system.

11. The method for testing or debugging an integrated circuit according to claim 10, further comprising driving inbound debug interface sequences to both the debug interface controller and the debug interface multiplexer via a debug interface receiver.

12. The method for testing or debugging an integrated circuit according to claim 10, further comprising observing inbound debug interface sequences from external debug interface hardware via a debug interface monitor port on the debug interface controller.

13. The method for testing or debugging an integrated circuit according to claim 12, wherein the inbound debug interface sequences from external debug interface hardware may include TRST (Test Reset), TCK (Test Clock), TMS (Test Mode Select), or TDI (Test Data In).

14. The method for testing or debugging an integrated circuit according to claim 10, further comprising feeding debug interface responses from the integrated circuit back through the debug interface multiplexer which may include TDO Nest Data Out).

15. The method for testing or debugging an integrated circuit according to claim 10, further comprising redriving the plurality of debug interface signals and data back to the integrated circuit via a debug interface driver for implementation by the integrated circuit.

16. The method for testing or debugging an integrated circuit according to claim 10, further comprising commanding and configuring the debug interface controller over a bus interface attached to the integrated circuit.

17. The method for testing or debugging an integrated circuit according to claim 10, further comprising controlling the integrated circuit via sideband control signals such as a RESET instruction for implementation by the integrated circuit.

18. A debug interface recorder and replay unit for a circuit card assembly, comprising:
a debug interface controller configured to monitor a plurality of debug interface instructions and data;
a storage buffer configured to store the plurality of debug interface instructions and data received from the debug interface controller during record operations and to supply the plurality of debug interface instructions and data to the debug interface controller during replay operations; and
a debug interface multiplexer configured to switch between a plurality of external debug interface inputs and the plurality of debug interface instructions and data from the debug interface controller for implementing the plurality of debug interface instructions and data on the circuit card assembly,
wherein the debug interface controller is commanded and configured over a bus interface coupled to the circuit card assembly.

* * * * *